(12) United States Patent  
Kim

(10) Patent No.: US 7,535,244 B2
(45) Date of Patent: May 19, 2009

(54) APPARATUS FOR TESTING A SEMICONDUCTOR DEVICE

(75) Inventor: Sung Bong Kim, Yongin-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

(21) Appl. No.: 11/559,198

(22) Filed: Nov. 13, 2006

(65) Prior Publication Data

US 2007/0126453 A1    Jun. 7, 2007

(30) Foreign Application Priority Data

Nov. 14, 2005    (KR) .................. 10-2005-0108663

(51) Int. Cl.
*G01R 31/26* (2006.01)
(52) U.S. Cl. ..................................... 324/765
(58) Field of Classification Search ................ 324/754, 324/761–762, 760, 765, 158.1, 763; 257/48; 439/257, 620, 15, 620.2, 620.25, 823, 826, 439/855; 438/14–18
See application file for complete search history.

(56) References Cited

U.S. PATENT DOCUMENTS

| | | | | |
|---|---|---|---|---|
| 5,642,054 A | * | 6/1997 | Pasiecznik, Jr. | 324/754 |
| 5,672,981 A | * | 9/1997 | Fehrman | 324/760 |
| 6,097,199 A | * | 8/2000 | Jeng et al. | 324/755 |
| 6,462,570 B1 | * | 10/2002 | Price et al. | 324/754 |
| 6,714,888 B2 | * | 3/2004 | Mori et al. | 702/120 |
| 6,891,384 B2 | * | 5/2005 | Mardi et al. | 324/754 |
| 7,071,487 B2 | * | 7/2006 | Maruyama | 257/48 |

* cited by examiner

*Primary Examiner*—Jermele M Hollington
*Assistant Examiner*—Tung X Nguyen
(74) *Attorney, Agent, or Firm*—Sherr & Vaughn, PLLC

(57) ABSTRACT

Disclosed herein is an apparatus for testing a semiconductor device in a cost-saving manner. The apparatus may include a first substrate having a plurality of drive circuits for supplying various test signals, and a second substrate detachably connected to the first substrate. One side of the second substrate may be electrically connected with the first substrate and the other side thereof may be electrically connected with a semiconductor device such that the respective test signals are supplied from the drive circuits to the semiconductor device.

20 Claims, 3 Drawing Sheets

APPARATUS FOR TESTING A SEMICONDUCTOR DEVICE

The present application claims priority under 35 U.S.C. 119 and 35 U.S.C. 365 to Korean Patent Application No. 10-2005-0108663 (filed on Nov. 14, 2005), which is hereby incorporated by reference in its entirety.

BACKGROUND

In development and production of semiconductor devices, testing costs may be 50% of the total manufacturing costs. Relatively high testing costs may be attributed to the gradual switchover to NANO processes and relatively fast development of various system LSI technologies. Some testing may verify if a manufactured chip operates, which may improve reliability and yield. Testing may be an important aspect of minimizing manufacturing costs.

CMOS image sensors (CIS), which may be implemented in IT information industry, may be used to generate and/or transmit picture images in digital cameras, cellular phones, or other devices. Manufacturers in the semiconductor area may need CIS test technologies to perform failure analysis and improve yield.

A CMOS image sensor is an image sensor, which may include an integrated circuit having hundreds of thousands to millions of embedded pixels. Each pixel may function to convert light-energy into an electrical signal. Visible original images (e.g. people or objects) may be converted into output electrical signals. An apparatus which may test electrical and optical properties of image sensors may require a separate illuminator to supply light, which may be different to a testing apparatus used to test other types of semiconductor devices.

In order to test electrical and optical signals of an image sensor in the form of a chip, a special digital signal processing (DSP) device and a programming technology (which may control the DSP device in a precision and efficient manner) may be needed. A semiconductor device tester may include a substrate equipped with multiple drive circuits (which may supply various test signals). Multiple connectors may be mounted on a substrate, which may connect to semiconductor device (e.g. an image sensor). A semiconductor device may be electrically connected with a connector and may be supplied with various test signals from drive circuits mounted on a substrate.

To test a semiconductor device in a wafer, a substrate may include multiple probe pins. Probe pins may come in close contact with the surface of a wafer and may supply test signals to the wafer. Test equipment may inspect a wafer on a die basis. Different semiconductor devices may have different shapes and sizes. Different test substrates may have to be used for different semiconductor devices, which may not allow for the minimization of costs.

SUMMARY

Embodiments relate to an apparatus which tests a semiconductor device. Embodiments relate to an apparatus which may test a semiconductor device and may minimize costs. Embodiments relate to an apparatus that may include a first substrate including a drive circuit and a second substrate electrically connected to the first substrate. A second substrate may simultaneously have an electrical connection with a semiconductor device and a first substrate. A second substrate may be detachable from a first substrate, which may enable minimization of costs.

In embodiments, an apparatus comprises a first substrate having a plurality of drive circuits which supply various test signals and a second substrate. A second substrate may be detachably connected to a first substrate. One side of a second substrate may be electrically connected to a first substrate, while the other side of the second substrate may be electrically connected to a semiconductor device, in accordance with embodiments. Respective test signals may be supplied from at least one drive circuit to a semiconductor device.

In embodiments, a first substrate may include a plurality of signal transmission lines, which may transmit respective test signals from respective drive circuits. A first substrate may include a plurality of first signal transmission terminals, which may electrically connect to respective signal transmission lines.

In embodiments, a second substrate may include second signal transmission lines electrically connected to respective signal transmission terminals of a first substrate. A second substrate may include a plurality of second signal transmission terminals electrically connected to respective second signal transmission lines. In embodiments, an apparatus may include a socket into which a semiconductor device is inserted. A socket may be electrically connected to second signal transmission terminals.

A second substrate may include a plurality of second signal transmission terminals connected to first signal transmission terminals of a first substrate, in accordance with embodiments. A plurality of probe pins may be electrically connected on one side of a second substrate, which may contact a semiconductor device, while second signal transmission lines may be on the other side of the second substrate.

Drive circuits may be mounted on a first face of a first substrate, in accordance with embodiments. A second substrate is attached to a second face of a first substrate. Drive circuits may include an amplifier and an analog-to-digital converter.

BRIEF DESCRIPTION OF THE DRAWINGS

Example

Example

Example

DETAILED DESCRIPTION

Figure 1:
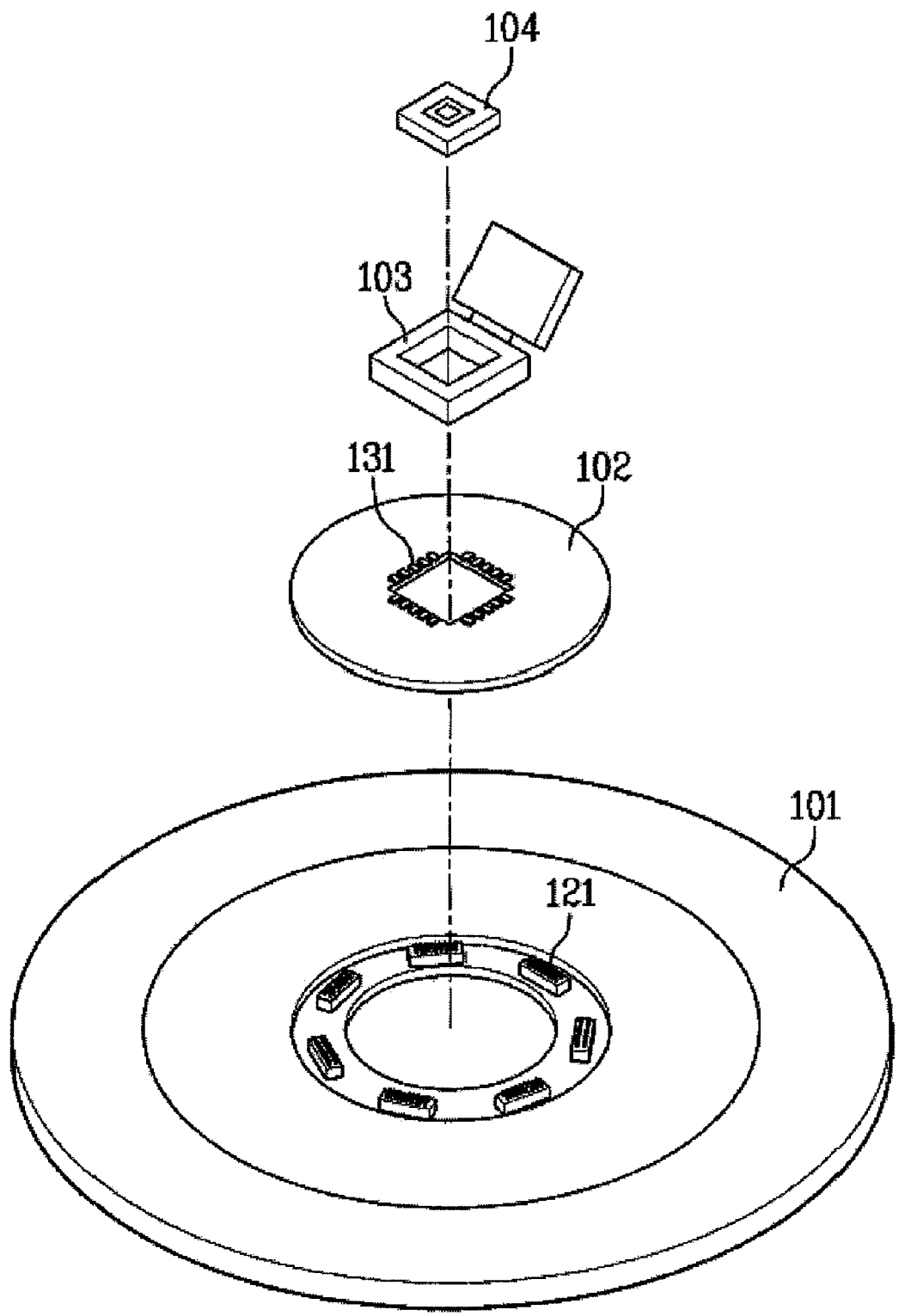
FIG. 1 illustrates a semiconductor device tester, in accordance with embodiments.

Example FIG. 1 illustrates a semiconductor device tester, according to embodiments. Example FIG. 2 illustrates a rear view of a first substrate, according to embodiments.

Figure 2:
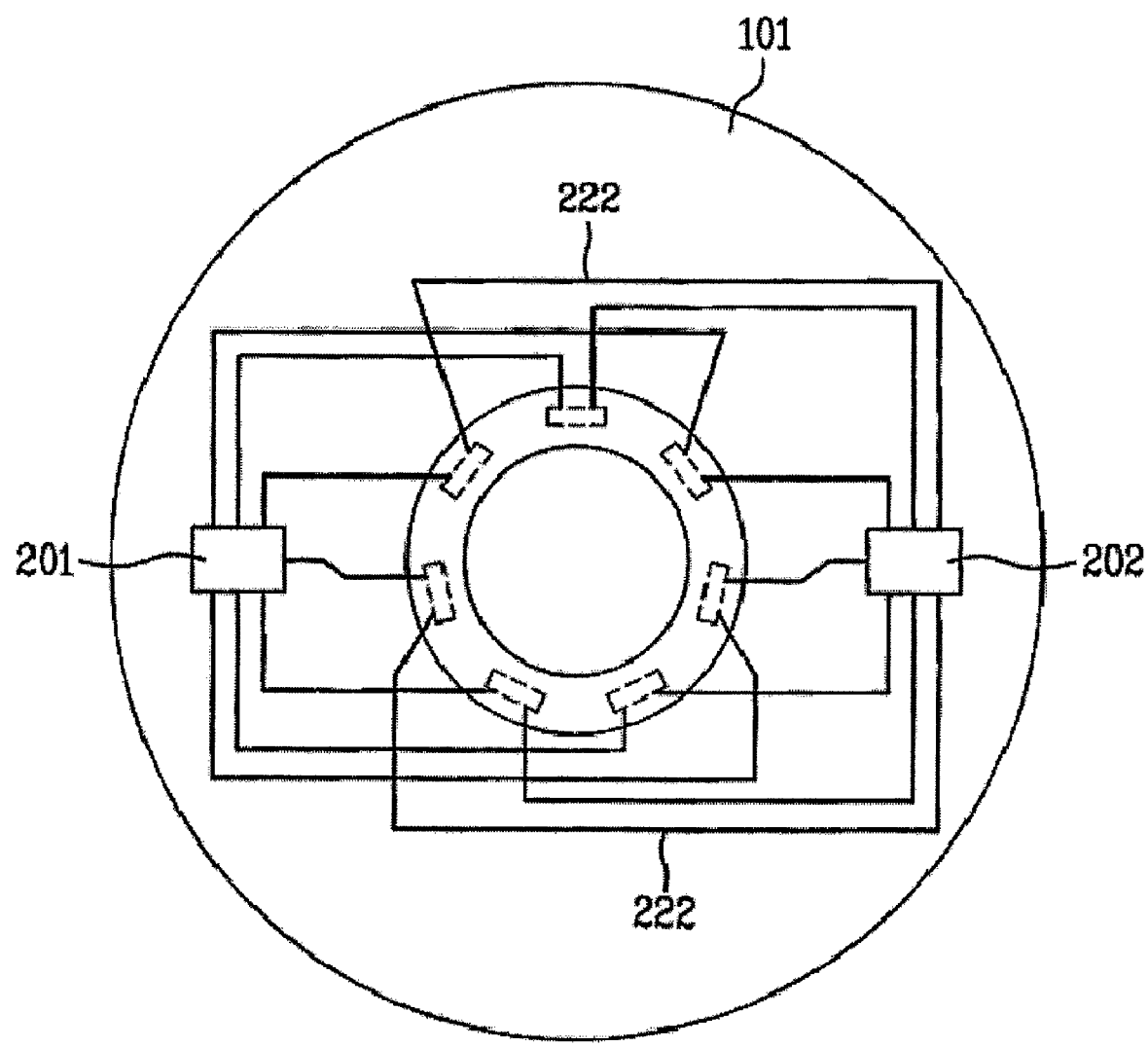
FIG. 2 illustrates a rear view of a first substrate, in accordance with embodiments.

As illustrated in FIGS. 1 and 2, semiconductor device tester 104 may include first substrate 101 and second substrate 102, in accordance with embodiments. Multiple drive circuits may be mounted on first substrate 101 and may supply various test signals. A first side of second substrate 102 may be electrically connected with first substrate 101, such that respective test signals may be supplied to semiconductor device 104 from multiple drive circuits. A second side of second substrate 102 may be electrically connected to semiconductor device 104. Second substrate 102 may be electrically and detachably coupled to first substrate 101.

First substrate 101 and second substrate 102 may have a circular shape, in embodiments. A circular opening may be formed at or near the center of first substrate 101. A rectangular opening may be formed at or near the center of second substrate 102. Openings in first substrate 101 and second substrate 102 may be arranged to face each other. Light may be projected through openings in first substrate 101 and second substrate 102. Light may be projected on semiconductor device 104.

As illustrated in FIG. 2, first substrate 101 may include a plurality of first signal transmission lines 222 for transmitting respective test signals from respective drive circuits, in accordance with embodiments. First substrate 101 may include a plurality of first signal transmission terminals 121 electrically connected to respective first signal transmission lines 222. Drive circuits may include amplifier 201 (e.g. which may amplify test signals) and/or analog-to-digital (A/D) converter 202 (e.g. which may convert an analog test signal into a digital signal). Drive circuits (e.g. amplifier 201 and/or A/D converter 202) may transmit a test signal to first signal transmission terminals 121 through first signal transmission lines 222.

In embodiments, first signal transmission lines 222 may be formed on a second side of first substrate 101. First signal transmission terminals 121 may be formed on a first side of first substrate 101. First signal transmission terminals 121 may be formed around an opening in first substrate 101.

In embodiments, second substrate 102 may be used to test semiconductor device 104 in the form of a chip. Second substrate 102 may include second signal transmission lines (not shown) electrically connected with respective first signal transmission terminals 121 of first substrate 101. A plurality of second signal transmission terminals 131 may be electrically connected with respective second signal transmission lines. Second signal transmission lines of second substrate 102 may receive test signals from first signal transmission terminals 121 of first substrate 101 and may transmit the test signals to second signal transmission terminals 131.

In embodiments, a semiconductor device tester may include socket 103 into which a semiconductor device may be inserted. Socket 103 may include socket 103 electrically connected to second signal transmission terminals 131. In embodiments, semiconductor device 104 may be in chip form. An opening in socket 103 may be aligned with openings of first substrate 101 and second substrate 102. Light may be projected onto semiconductor device 104 through aligned openings of first substrate 101 and second substrate 102. In embodiments, a semiconductor device being tested may be an image sensor. Socket 103 may receive test signals from second signal transmission terminals 131 and transmits them to semiconductor device 104. Semiconductor device 104 may be operated by transmitted test signals.

In embodiments, an operator may prepare multiple second substrates 102 according to the types of semiconductor devices 104. For each test, second substrate 102, which may correspond to the type of semiconductor device 104 being tested, may be connected to first substrate 101. In embodiments, each type of semiconductor device may be easily tested.

In embodiments, absent first substrate 101 and second substrate 102, multiple substrates (e.g. which substitute first substrate 101) may need to be prepared according to the types of semiconductor devices. In embodiments, only second substrate 102 may need replaced when testing a different type of semiconductor device 104, without having to replace the entire substrate (e.g. first substrate 101).

First substrate 101 may be larger than second substrate 102, according to embodiments. First substrate 101 may be mounted with a relatively large number of drive circuits, according to embodiments. In embodiments, manufacturing costs of first substrate 101 may be higher than second substrate 102. In embodiments, only one type of first substrate 101 is used, regardless of the type of semiconductor devices 104. In embodiments, multiple second substrates 102 (e.g. which may be relatively inexpensive) may need to be made, which may minimize costs. The number of second substrates 102 that may need to be made is correlated with the number of types semiconductor devices 104 that may need to be tested.

Figure 3:
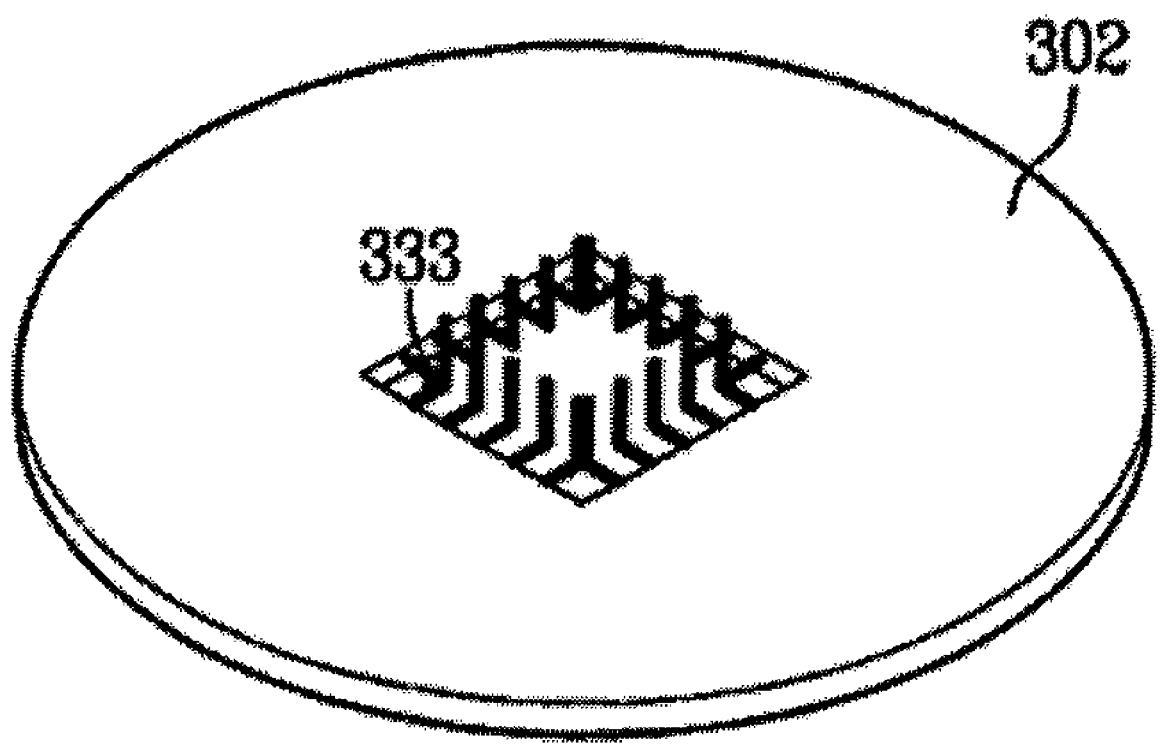
FIG. 3 illustrates a second substrate, in accordance with embodiments.

As illustrated in FIG. 3, second substrate 302 may be used to test semiconductor device 104 in the form of a wafer, in accordance with embodiments. Second substrate 302 may include multiple second signal transmission terminals 131 and/or multiple probe pins 333. Second signal transmission terminals 131 may be connected to first signal transmission terminals 121, which may be in first substrate 101. A first side of respective probe pins 333 may be electrically coupled to second signal transmission lines. A second side of respective probe pins 333 may be electrically coupled to semiconductor device 104, which may be in the form of a wafer.

Second substrate 302 may have a rectangular opening formed at the center of second substrate, in accordance with embodiments. A first end of probe pins 333 may be connected to respective sides which may form a rectangular opening. A second end of probe pins 333 may be bent at substantially a right angle (e.g. ~90°) to contact semiconductor device 104, which may be in the form of a wafer. Second substrate 302 may have different configurations in accordance with the type of semiconductor device 104 being tested.

In embodiments, when semiconductor device 104 is in the form of a chip is tested, first substrate 101, second substrate 102, and the semiconductor socket 103 may be used. In embodiments, when semiconductor device 104 is in the form of a wafer is being tested, first substrate 101 and second substrate 102 are used. In accordance with embodiments, first substrate 101 may be common to testing of different types of semiconductor devices 104.

In embodiments, testing of a semiconductor device can be implemented with relative ease by using a plurality of second substrates that correspond to different types of semiconductor devices being tested. In embodiments, a first substrate may be universally used, regardless of the type of semiconductor device being tested, which may allow for cost minimization.

It will be apparent to those skilled in the art that various modifications and variations can be made to embodiments. Thus, it is intended that embodiments cover modifications and variations thereof within the scope of the appended claims.

What is claimed is:

1. An apparatus comprising:
a first substrate comprising a plurality of drive circuits configured to supply test signals to a semiconductor device, first signal transmission lines electrically connected to the drive circuits and configured to transmit the test signals from the drive circuits, and a plurality of first signal transmission terminals electrically connected to the first signal transmission lines, the first substrate having a first opening at an inner periphery thereof for projecting light on the semiconductor device; and
a second substrate electrically connected to the first substrate and detachable from the first substrate, said second substrate comprising second signal transmission lines and a plurality of second signal transmission terminals electrically connected to the second signal transmission lines, wherein the first signal transmission terminals are electrically connected to the second signal transmission lines and the second signal transmission terminals are electrically connected to the first signal transmission lines, the second substrate having a second opening at an inner periphery thereof for projecting light on the semiconductor device, the second opening being concentric to the first opening of the first substrate.

2. The apparatus of claim 1, wherein:
a first side of the second substrate is electrically connected to the first substrate, the second transmission terminals are provided on a second side of the second substrate and the second side of the second substrate is electrically connected to a semiconductor device.

3. The apparatus of claim 1, wherein the plurality of second signal transmission terminals are configured to provide the test signals from the drive circuits to the semiconductor device.

4. The apparatus of claim 1, further comprising a socket configured to receive the test signals from the second signal transmission terminals and transmit the test signals to a semiconductor device electrically connected to the second signal transmission terminals of the second substrate, wherein the semiconductor device is operated by the test signals.

5. The apparatus of claim 1, wherein the apparatus is configured to test at least one semiconductor device.

6. The apparatus of claim 1, the second substrate including at least one probe pin having a first end first end electrically connected to the second signal transmission lines and a second end electrically connected to and directly contacting the semiconductor device.

7. The apparatus of claim 1, wherein:
the drive circuits are mounted on a first face of the first substrate; and
the second substrate is attachable to a second face of the first substrate.

8. The apparatus of claim 1, wherein the drive circuits comprise at least one of an amplifier and an analog-to-digital converter.

9. An apparatus for testing a semiconductor device comprising:
a first substrate for transmitting test signals to the semiconductor device which operate the semiconductor device, the first substrate having a first opening for projecting light on the semiconductor device;
a second substrate electrically connected to the first substrate for receiving the test signals from the first substrate, the second substrate having a second opening aligned with the first opening of the first substrate for projecting light on the semiconductor device; and
a support electrically connected to and supported by the second substrate, the support having a support surface for receiving the semiconductor device socket and directly transmitting the test signals received from the second substrate to the semiconductor device,
wherein the support has a third opening aligned with the first opening of the first substrate and the second opening of the second substrate for projecting light on the semiconductor device.

10. The apparatus of claim 9, further comprising:
drive circuits provided at the first substrate for supplying the test signals;
first signal transmission lines provided at the first substrate and electrically connected to the drive circuits for transmitting the test signals received from the drive circuits; and
first signal transmission terminals provided at the first substrate and electrically connected to the first signal transmission lines.

11. The apparatus of claim 10, further comprising:
second signal transmission lines provided at the second substrate for receiving the test signals from the first substrate;
second signal transmission terminals provided at the second substrate and electrically connected to the second signal transmission lines and the support,
wherein the first signal transmission terminals are electrically connected to the second signal transmission lines and the second signal transmission terminals.

12. The apparatus of claim 9, further comprising:
second signal transmission lines provided at the second substrate for receiving the test signals from the first substrate;
second signal transmission terminals provided at the second substrate and electrically connected to the second signal transmission lines and the support.

13. An apparatus for testing a semiconductor device comprising:
a first substrate for transmitting test signals, the first substrate having a first opening for projecting light on the semiconductor device; and
a second substrate electrically connected to and contacting the first substrate to receive the test signals from the first substrate and electrically connected to and contacting the semiconductor device to transmit the test signals to the semiconductor device for operating the semiconductor device, the second substrate having a second opening aligned with the first opening of the first substrate for projecting light on the semiconductor device.

14. The apparatus of claim 13, further comprising:
drive circuits provided at the first substrate for supplying the test signals;
first signal transmission lines provided at the first substrate and electrically connected to the drive circuits for transmitting the test signals received from the drive circuits; and
first signal transmission terminals provided at the first substrate and electrically connected to the first signal transmission lines.

15. The apparatus of claim 14, further comprising:
second signal transmission terminals provided at the second substrate electrically connected to the first signal transmission terminals;
probe pins provided at the second substrate for transmitting the test signals to the semiconductor device.

16. The apparatus of claim 15, wherein the probe pins have a first end electrically connected to the second signal transmission lines and a second end electrically connected to the semiconductor device.

17. The apparatus of claim 16, wherein the second end of the probe pins is bent at substantially a right angle to contact the semiconductor device.

18. The apparatus of claim 13, further comprising:
second signal transmission terminals provided at the second substrate electrically connected to the first substrate;
probe pins provided at the second substrate for transmitting the test signals to the semiconductor device.

19. The apparatus of claim 18, wherein the probe pins have a first end electrically connected to the second substrate and a second end electrically connected to the semiconductor device.

20. The apparatus of claim 19, wherein the second end of the probe pins is bent at substantially a right angle to contact the semiconductor device.

* * * * *